(12) United States Patent
Shiraishi (10) Patent No.: US 11,694,735 B2
(45) Date of Patent: Jul. 4, 2023

(54) MEMORY CONTROLLER AND METHOD OF CONTROLLING THE MEMORY CONTROLLER

(71) Applicant: CANON KABUSHIKI KAISHA, Tokyo (JP)

(72) Inventor: Daisuke Shiraishi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/578,797

(22) Filed: Jan. 19, 2022

(65) Prior Publication Data

US 2022/0246187 A1    Aug. 4, 2022

(30) Foreign Application Priority Data

Feb. 2, 2021  (JP) ................. 2021-015139

(51) Int. Cl.
  *G11C 7/22*  (2006.01)
  *G11C 7/10*  (2006.01)
(52) U.S. Cl.
  CPC ............ *G11C 7/222* (2013.01); *G11C 7/109* (2013.01); *G11C 7/1048* (2013.01); *G11C 7/1063* (2013.01)
(58) Field of Classification Search
  CPC .................... G11C 7/222; G11C 7/22

USPC ....................................... 365/233.1
See application file for complete search history.

(56) References Cited

U.S. PATENT DOCUMENTS

2020/0213464 A1* 7/2020 Nakamura .......... G06F 13/1668
2020/0342934 A1* 10/2020 Lee .................. G11C 11/40611
2021/0141567 A1* 5/2021 Shiraishi .............. G06F 3/0673

FOREIGN PATENT DOCUMENTS

JP    2020-109642 A    7/2020

* cited by examiner

*Primary Examiner* — Muna A Techane
(74) *Attorney, Agent, or Firm* — Carter, DeLuca & Farrell LLP

(57) ABSTRACT

A memory controller for accessing a memory, comprises a holding circuit which holds a plurality of read or write access requests from a bus master, a read/write control circuit which selects one of the access requests in the holding circuit and issues a read command or a write command; and an active control circuit which selects the access request held in the holding circuit and issues an active command, wherein the active control circuit includes a generation circuit that generates number of activated read commands and number of activated write commands, and a selection circuit that, when the number of activated read commands is not less a threshold, issues the active command of an read access, and when the number of activated write commands is not less than the threshold, issues the active command of a write access.

6 Claims, 6 Drawing Sheets

MEMORY CONTROLLER AND METHOD OF CONTROLLING THE MEMORY CONTROLLER

BACKGROUND OF THE INVENTION

Field of the Invention

The present invention relates to a memory controller and a method of controlling the memory controller.

Description of the Related Art

DRAM is commonly used as a main storage of a computer system. With higher functionality and higher performance of the computer system, performance requirements for the DRAM have increased, and various techniques of a memory controller have been proposed to exert performance of the DRAM to the maximum.

When an active command to different banks of the DRAM is issued, an interval of tRRDs (RAS to RAS delay) is needed between the active commands. If a read write command following a preceding active command is completed before the start of a read command or a write command for a subsequent active command, a gap caused by the tRRD occurs in a data bus, which leads to a decrease in memory utilization efficiency.

Document: Japanese Patent Laid-Open No. 2020-109642 describes counting the number of read commands or write commands for which the active command is issued, and raising priority of the active command for a memory access request including a large number of read commands or write commands when the number of read commands or write commands becomes less than a preset threshold.

According to the technique illustrated in this patent, when the number of read commands or write commands for which the active command is issued becomes less than the preset threshold, the priority of the active command for the memory access request including a large number of read commands or write commands is raised. Thus, the issue of the active command for the memory access request including a small number of read commands or write commands may be put on hold continuously. Thus, a function of detecting a timeout is required to prioritize the active command put on hold for a predetermined period of time. When there are a plurality of timeout active commands, the active command is issued to the memory access request including the largest number of read commands or write commands. Thus, the issue of the active command for the memory access request including a small number of read commands or write commands is put on hold for a long period of time.

SUMMARY OF THE INVENTION

According to an aspect of the invention, there is provided a memory controller configured to access a memory including a plurality of banks, comprising: a holding circuit configured to hold a plurality of read or write access requests from a bus master; a read/write control circuit configured to select one of the access requests held in the holding circuit and issue a read command or a write command; and an active control circuit configured to select the access request held in the holding circuit and issue an active command, wherein the active control circuit includes a generation circuit that generates number of activated read commands and number of activated write commands, the number of activated read commands is the total number of read commands of an access for which the active command is issued among the access requests held in the holding circuit, and the number of activated write commands is the total number of the write commands of an access for which the active command is issued among the access requests held in the holding circuit, and a selection circuit that, when the number of activated read commands is equal to or more than a first threshold, preferentially issues the active command of an read access in which the number obtained by adding the number of read commands of each of the read accesses requiring issue of the active command among the accesses held in the holding circuit and the number of activated read commands is equal to or more than a second threshold and, when the number of activated write commands is equal to or more than the first threshold, preferentially issues the active command of a write access in which the number obtained by adding the number of write commands of each of the write accesses requiring the issue of the active command among the accesses held in the holding circuit and the number of activated write commands is equal to or more than the second threshold.

According to the present invention, it is possible to suppress the decrease in memory utilization efficiency caused by the tRRD without putting on hold for the issue of the active command for the memory access request including a small number of read or write commands for a long period of time.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 1:
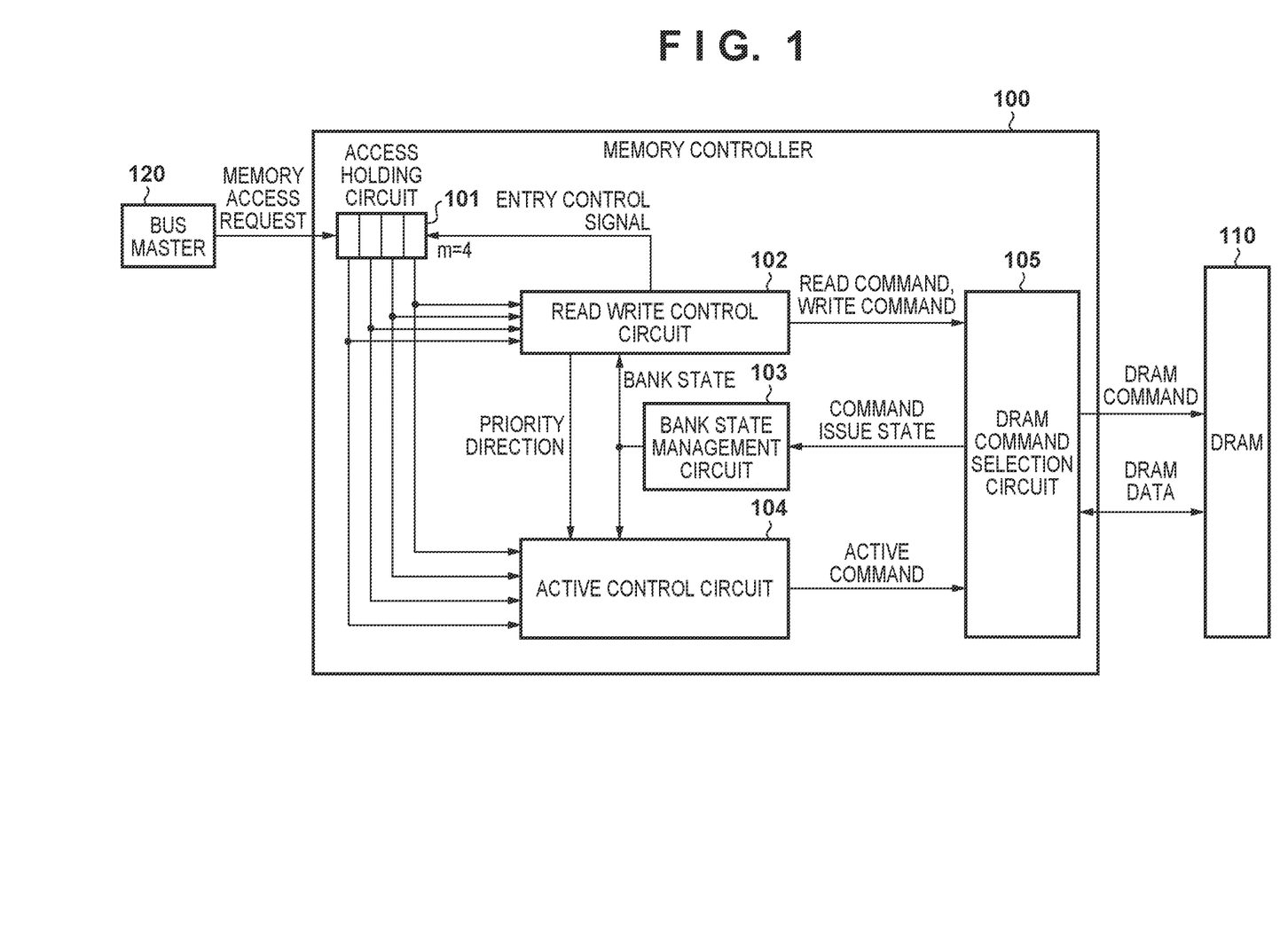
FIG. 1 is a configuration diagram of a memory controller in an embodiment.

FIG. 1 is a configuration diagram of a memory controller 100 in the present embodiment. The memory controller 100 is connected to a DRAM 110 including a plurality of banks and a bus master 120. The bus master 120 transmits a memory access request including address information and write data to the memory controller 100. The memory controller 100 generates a DRAM command based on the memory access request received from the bus master 120, and transmits the generated DRAM command to the DRAM 110. Furthermore, the memory controller 100 transfers data to/from the DRAM 110 based on the transmitted DRAM command.

Figures 2, 3:
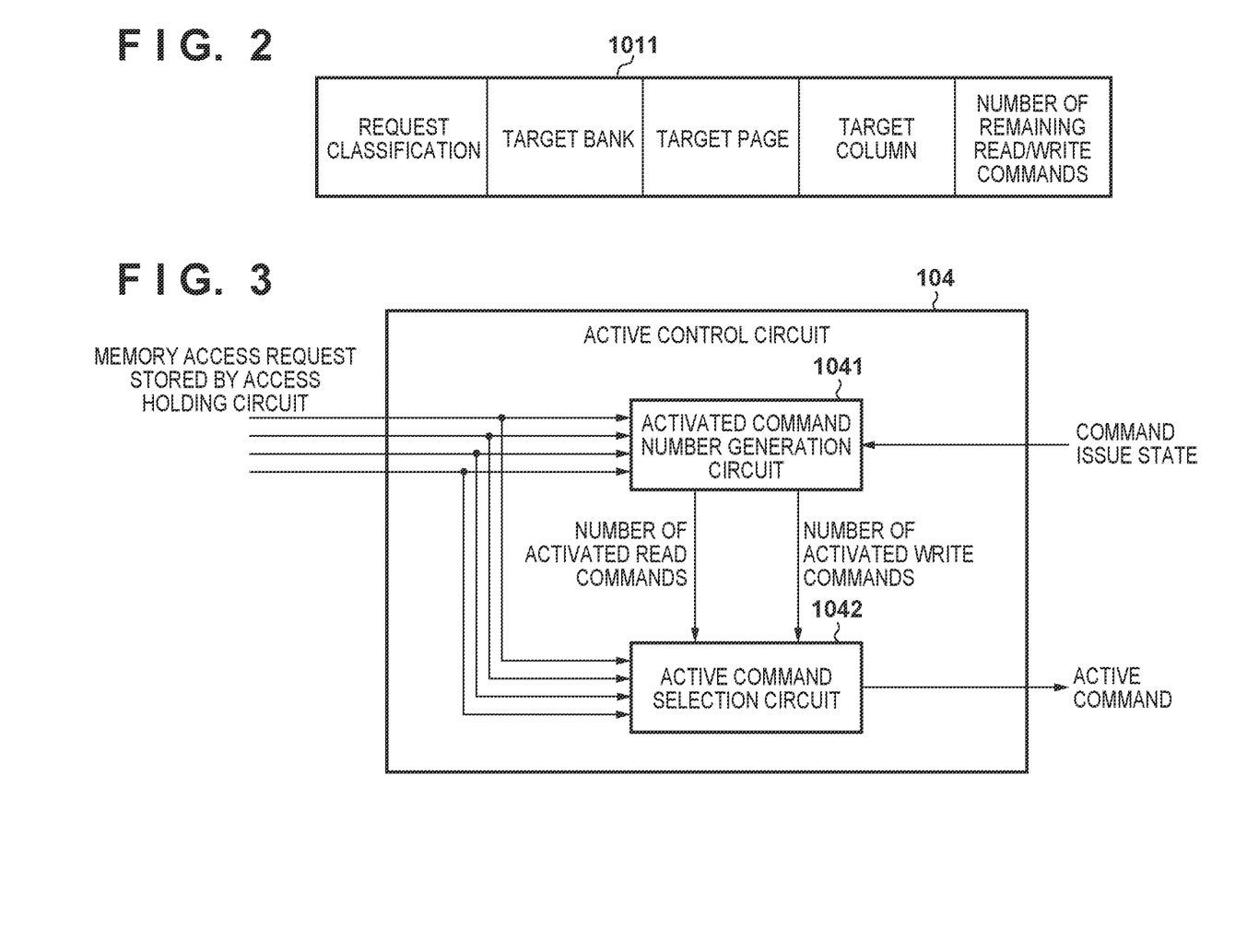
FIG. 2 is a configuration diagram of an access holding circuit entry in the embodiment.
FIG. 3 is a configuration diagram of an active control circuit in the embodiment.

First, an access holding circuit 101 in the memory controller 100 will be described. The access holding circuit 101 is a buffer that holds a plurality of read access requests or write access requests (hereinafter, these access requests are simply referred to as memory access requests) to the DRAM 110 output from the bus master 120. The access holding circuit 101 includes m (m≥2) entries. While four entries are illustrated in the drawing, this example is merely illustrative. The number of entries m that can be held by the access holding circuit 101 is not particularly limited. FIG. 2 is a configuration diagram of an entry 1011 in the access holding circuit 101 of the embodiment. Therefore, the access holding circuit 101 includes m entries 1011 illustrated in FIG. 2. As illustrated in FIG. 2, the entry 1011 includes fields for request classification, a target bank, a target page, a target column, and the number of remaining read/write commands. The access holding circuit 101 converts the memory access received from the bus master 120 so that the memory access corresponds to each field, and holds the memory access. Information stored in each field is as follows.

(a) Request Classification Field

The request classification field indicates classification of the memory access request stored in the entry WRITE: the memory access request is "write" (data writing)

READ: the memory access request is "read" (data reading)

(b) Target Bank Field

The target bank field is a bank address accessed by the memory access request stored in the entry (c) Target Page Field The target page field is a page address accessed by the memory access request stored in the entry (d) Target Column Field The target column field is a first column address accessed by the memory access request stored in the entry (e) Remaining Read/Write Command Number Field The remaining read/write command number field is the number of remaining DRAM read/write commands executed by the memory access request stored in the entry When the access holding circuit 101 receives the memory access request from the bus master 120, the access holding circuit 101 stores the memory access request in the entry following an end of the stored memory access request. When the memory access request is read from the access holding circuit 101, the memory access request can be read from any entry.

Subsequently, an entry control signal input to the access holding circuit 101 will be described. The entry control signal is constituted of an entry number field, a deletion field, and an update field. When 1 is set in the deletion field, the access holding circuit 101 deletes the entry indicated by the entry number field. When 1 is set in the update field, the access holding circuit 101 updates the column field of the entry indicated by the entry number field to the first column address accessed by the next DRAM command. Furthermore, the access holding circuit 101 updates the remaining read/write command number field to a value obtained by subtracting 1.

Next, a read/write control circuit 102 will be described. The read/write control circuit 102 can reference all of the memory access requests held by the access holding circuit 101. The read/write control circuit 102 selects any memory access request from the memory access request for which a page to be accessed is open among the memory access requests held by the access holding circuit 101. Whether the page accessed by the memory access request is open is determined from the target bank field and target page field of the access holding circuit entry 1011 and a bank state generated by a bank-state management circuit 103. The read/write control circuit 102 generates a read command and a write command from the selected memory access request, and outputs the read command or the write command to a dram-command selection circuit 105. The read/write control circuit 102 of the present embodiment selects the memory access request to sequentially issue the read command and the write command in order to suppress a read/write switching penalty. Then, the read/write control circuit 102 outputs a priority direction, indicating which of a read access and a write access is preferentially selected at present, to the active control circuit 104.

Subsequently, a procedure in which the read/write control circuit 102 generates the entry control signal will be described. When the last read command or the last write command executed by the memory access request is issued, the processing of the corresponding memory access request is completed. Therefore, in this case, the read/write control circuit 102 generates the entry control signal to delete the corresponding entry from the access holding circuit 101. On the other hand, when a non-last read command or write command is issued, the read/write control circuit 102 generates an entry control signal to update the corresponding entry of the access holding circuit 101. However, when the last read command or write command is issued, it is not necessary to update the corresponding entry. Whether or not the issued read command or write command is the last is determined by checking whether the remaining react/write command number field of the access holding circuit entry 1011 is 1.

Next, the bank-state management circuit 103 will be described. The bank-state management circuit 103 receives information indicating a command issue state from the dram-command selection circuit 105, and updates the bank state. The information indicating the command issue state is constituted of the command classification issued to the DRAM 110, the bank in which the command is issued, and the page. The bank state includes whether or not the page is open for each bank constituting the DRAM 110, and the open page address.

Next, the active control circuit 104 will be described. The active control circuit 104 can reference all of the memory access requests held by the access holding circuit 101. The inputs of the active control circuit 104 are the memory access request stored in the access holding circuit 101, the bank state output by the bank-state management circuit 103, and the priority direction output by the read/write control circuit 102. The active control circuit 104 generates the number of activated read commands and the number of activated write commands based on the memory access request and the bank state stored in the access holding circuit 101. Then, the active control circuit 104 generates an active command based on the number of activated read commands and the number of activated write commands that have been generated, and the memory access request, bank state, and priority direction stored by the access holding circuit 101, and outputs the generated active command to the dram-command selection circuit 105.

FIG. 3 is a block configuration diagram of the active control circuit 104 in the present embodiment. The active control circuit 104 of the embodiment is constituted of an activated command number generation circuit 1041 and an active command selection circuit 1042.

The activated command number generation circuit 1041 determines whether or not the target bank has opened the target page for each memory access request stored by the access holding circuit 101 based on the bank state. Then, the number of activated read commands and the number of activated write commands are generated by totaling the number of read/write commands of the memory access request in which it is determined that the target page is open for each "read" and "write".

Figure 4A:
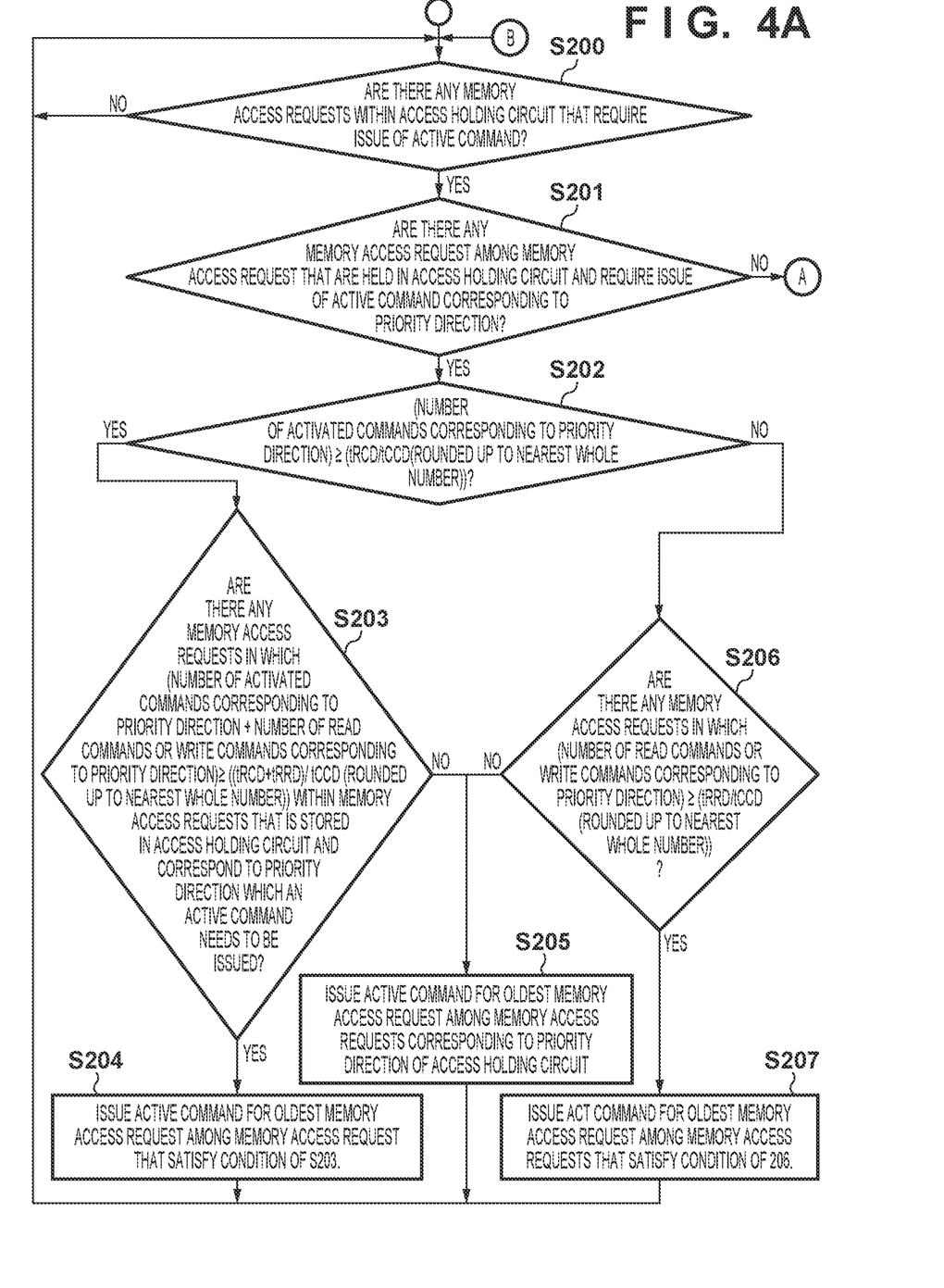
FIG. 4A is a flow chart for illustrating selection processing of an active command selection circuit in the embodiment.
Figure 4B:
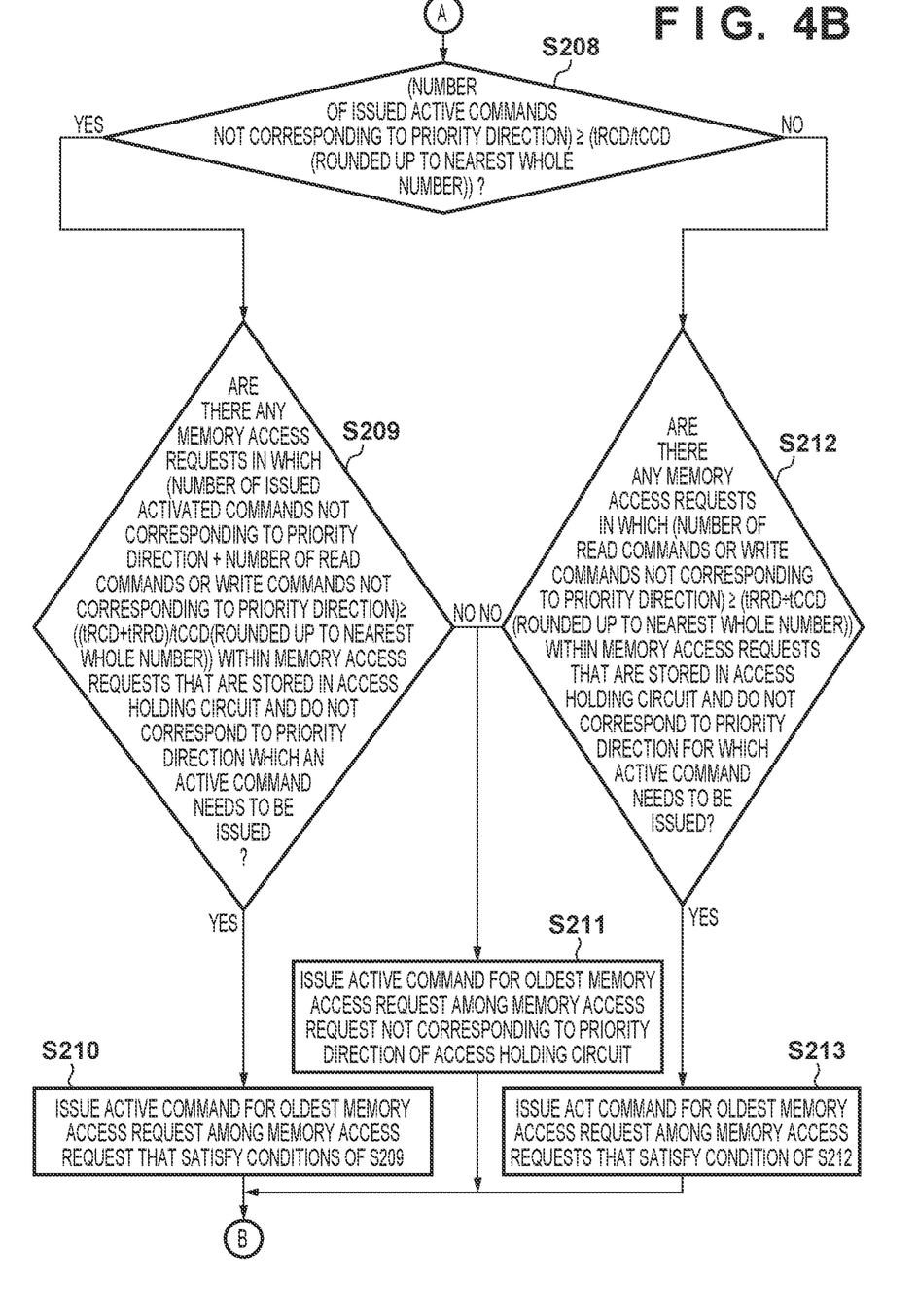
FIG. 4B is a flow chart for illustrating the selection processing of the active command selection circuit in the embodiment.

Then, the active command selection circuit 1042 generates the active command to be issued next based on the number of activated read commands, the number of activated write commands, the memory access request stored by the access holding circuit 101, the bank state, and the priority direction. The operation of the active command selection circuit 1042 will be described in more detail. FIGS. 4A and 4B are flow charts of an active command selection algorithm by the active command selection circuit 1042 of the present embodiment.

In S200, the active command selection circuit 1042 awaits the presence of the memory access request requiring the issue of the active command in the access holding circuit 101. That is, when there is no memory access request requiring the issue of the active command in the access holding circuit 101, the active command selection circuit 1042 does not issue the active command. When the active command selection circuit 1042 determines that there is the memory access request requiring the issue of the active command, the active command selection circuit 1042 causes the processing to proceed to S201.

In S201, the active command selection circuit 1042 determines whether or not the memory access request corresponding to the priority direction exists in the memory access request held in the access holding circuit 101. When the active command selection circuit 1042 determines that the memory access request corresponding to the priority direction exists, the active command selection circuit 1042 causes the processing to proceed to S202, and when the active command selection circuit 1042 determines that the memory access request does not exist, the active command selection circuit 1042 causes the processing to proceed to S208 (FIG. 4B).

In S202, the active command selection circuit 1042 determines whether or not the following condition 1 is satisfied.

The number of activated commands corresponding to priority direction≥*tRCD*÷*tCCD*(the digits after the decimal point are rounded up)  Condition 1:

In S202, when the active command selection circuit 1042 determines that the above condition 1 is satisfied, the active command selection circuit 1042 causes the processing to proceed to S203, and when the active command selection circuit 1042 determines that the condition 1 is not satisfied, the active command selection circuit 1042 causes the processing to proceed to S206.

In S203, the active command selection circuit 1042 determines whether or not there is the memory access request satisfying the following condition 2 among the memory access requests held in the access holding circuit 101, which requires the issue of the active command and corresponds to the priority direction.

(The number of activated commands corresponding to priority direction+the number of read commands or write commands corresponding to priority direction)≥((*tRCD*+*tRRD*)÷*tCCD*(the digits after the decimal point are rounded up))  Condition 2:

When the active command selection circuit 1042 determines that the memory access request satisfying the above condition 2 exists, the active command selection circuit 1042 causes the processing to proceed to S204, and when the active command selection circuit 1042 determines that the memory access request does not exist, the active command selection circuit 1042 causes the processing to proceed to S205.

In S204, the active command selection circuit 1042 issues the active command to the oldest memory access request among the memory access requests satisfying the above condition 2.

In S206, the active command selection circuit 1042 determines whether or not the memory access request satisfying the following condition 3 exists among the memory access requests corresponding to the priority direction in the access holding circuit 101.

The number of read commands or write commands corresponding to priority direction≥ (*tRRD*÷*tCCD*(the digits after the decimal point are rounded up))  Condition 3:

In S206, when the active command selection circuit 1042 determines that the memory access request satisfying the above condition 3 exists, the active command selection circuit 1042 causes the processing to proceed to S207, and when the active command selection circuit 1042 determines that the memory access request does not exist, the active command selection circuit 1047 causes the processing to proceed to S205.

In S207, the active command selection circuit 1042 issues the active command to the oldest memory access request among the memory access requests satisfying the condition 3 (S207).

In S205 (when the condition 2 of S203 is not satisfied or the condition 3 of S206 is not satisfied), the active command selection circuit 1042 issues the active command to the oldest memory access request of the memory access requests corresponding to the priority direction of the access holding circuit 101.

In S208, the active command selection circuit 1042 determines whether or not the following condition 4 is satisfied.

The number of activated commands not corresponding to priority direction≥*tRCD*÷*tCCD*(the digits after the decimal point are rounded up)  Condition 4:

When the active command selection circuit 1042 determines that the above condition 4 is satisfied, the active command selection circuit 1042 causes the processing to proceed to S209, and when the active command selection circuit 1042 determines that the condition 4 is not satisfied, the active command selection circuit 1042 causes the processing to proceed to S212.

In S209, the active command selection circuit 1042 determines whether or not there is the memory access request satisfying the following condition 5 among the memory access requests held in the access holding circuit 101, which requires the issue of the active command and does not correspond to the priority direction.

(The number of activated commands not corresponding to priority direction+the number of read commands or write commands not corresponding to priority direction of memory access request)≥(($tRCD+tRRD$)÷$tCCD$(the digits after the decimal point are rounded up))   Condition 5:

When the active command selection circuit 1042 determines that the memory access request satisfying the above condition 5 exists, the active command selection circuit 1042 causes the processing to proceed to S210, and when the active command selection circuit 1042 determines that the memory access request does not exist, the active command selection circuit 1042 causes the processing to proceed to S211.

In S210, the active command selection circuit 1042 issues the active command to the oldest memory access request among the memory access requests satisfying the above condition 5, and returns the processing to S200.

In S212, the active command selection circuit 1042 determines whether or not the memory access request satisfying the following condition 6 exists among the memory access requests not corresponding to the priority direction in the access holding circuit 101.

(The number of read commands or write commands not corresponding to priority direction of memory access request)≥($tRRD$÷$tCCD$(the digits after the decimal point are rounded up))   Condition 6:

When the memory access request satisfying the above condition 6 exists, the active command selection circuit 1042 causes the processing to proceed to S213, and when the active command selection circuit 1042 determines that the memory access request does not exist, the active command selection circuit 1042 causes the processing to proceed to S211.

In S213, the active command selection circuit 1042 issues the active command to the oldest memory access request among the memory access requests satisfying the above condition 6.

In S211 (when the condition 5 of S209 is not satisfied or the condition 6 of S212 is not satisfied), the active command selection circuit 1042 issues the active command to the oldest memory access request of the memory access requests not corresponding to the priority direction of the access holding circuit 101.

Finally, the dram-command selection circuit 105 will be described. The dram-command selection circuit 105 selects any one from the read command or write command output from the read/write control circuit 102 and the active command output from the active control circuit 104, and issues the command to the DRAM 110. Although not described in the present embodiment, a command such as a precharge command or a refresh command may also be selected together.

Figure 5:
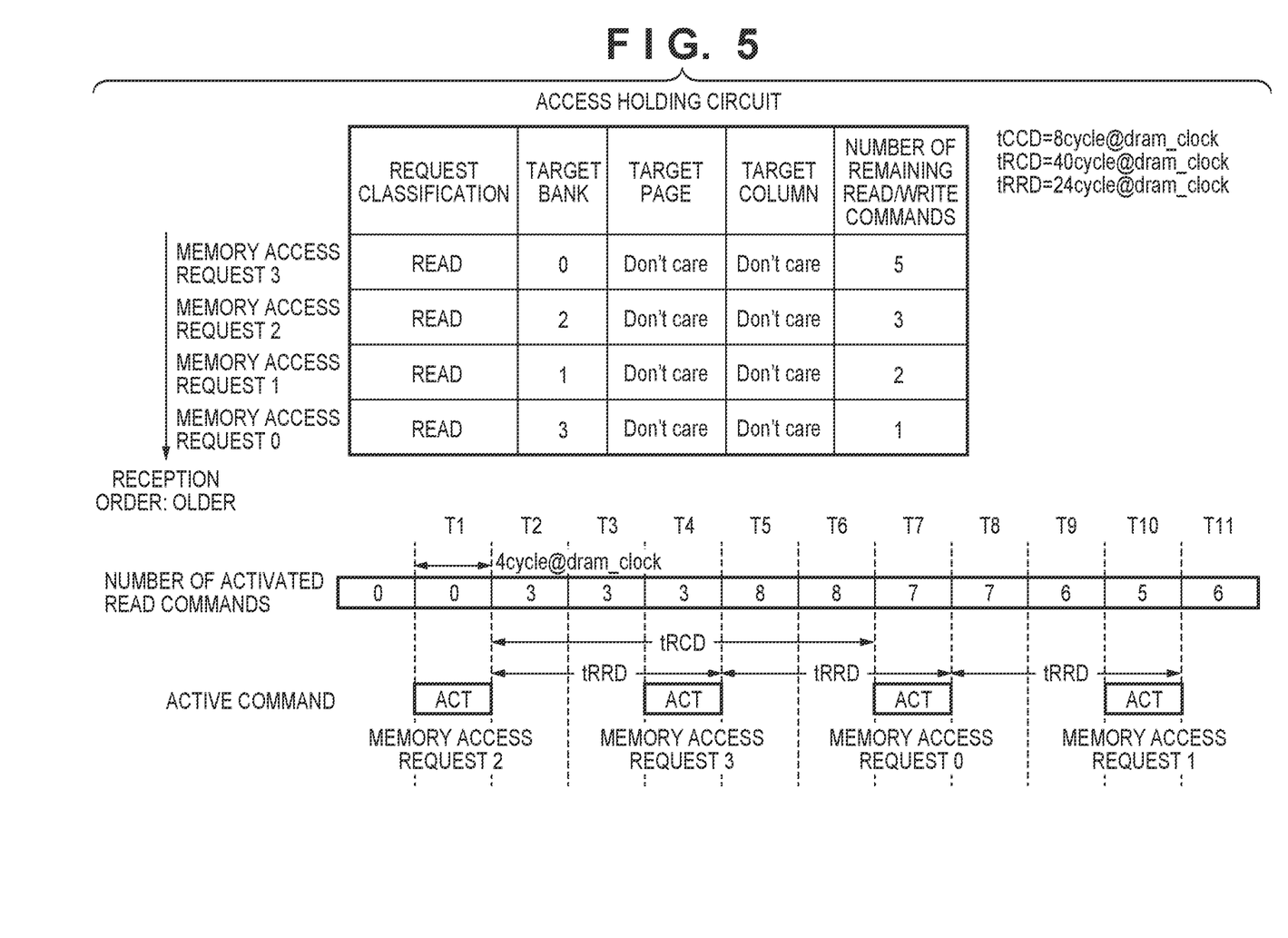
FIG. 5 is a diagram illustrating an operation example of active command selection in the embodiment.

FIG. 5 is a diagram illustrating an operation example of active command selection in the present embodiment. In the premise of this operation example, the priority direction is READ, and a timing constraint period and a state of the memory access request held in the access holding circuit 101 are illustrated in the figure. For the sake of explanation, memory access requests 0 to 3 and an identifier are assigned to each memory access request held in the access holding circuit 101.

At a timing T1, the number of activated read commands is 0 and less than ($tRCD$÷$tCCD$=5). Thus, the dram-command selection circuit 105 issues the active command for a memory access request 2, which requires the issue of the active command, and is the oldest memory access request of the memory access requests in which the number of remaining read/write commands is ($tRRD$÷$tCCD$=3) or more.

At a timing T4, the number of activated read commands is 3 and less than ($tRCD$÷$tCCD$=5). Thus, the dram-command selection circuit 105 issues the active command for a memory access request 3, which requires the issue of the active command, and is the oldest memory access request of the memory access requests in which the number of remaining read/write commands is ($tRRD$÷$tCCD$=3) or more.

At a timing T7, the number of activated read commands is 7 and ($tRCD$÷$tCCD$=5) or more. Thus, the dram-command selection circuit 105 issues the active command for a memory access request 0 which is the oldest memory access request of the memory access requests in which the number of activated read commands+the number of remaining read/write commands is (($tRCD+tRRD$)÷$tCCD$=8) or more.

At a timing T10, the dram-command selection circuit 105 issues the active command for a memory access request 1 which is the last memory access request requiring the issue of the active command.

Figure 6:
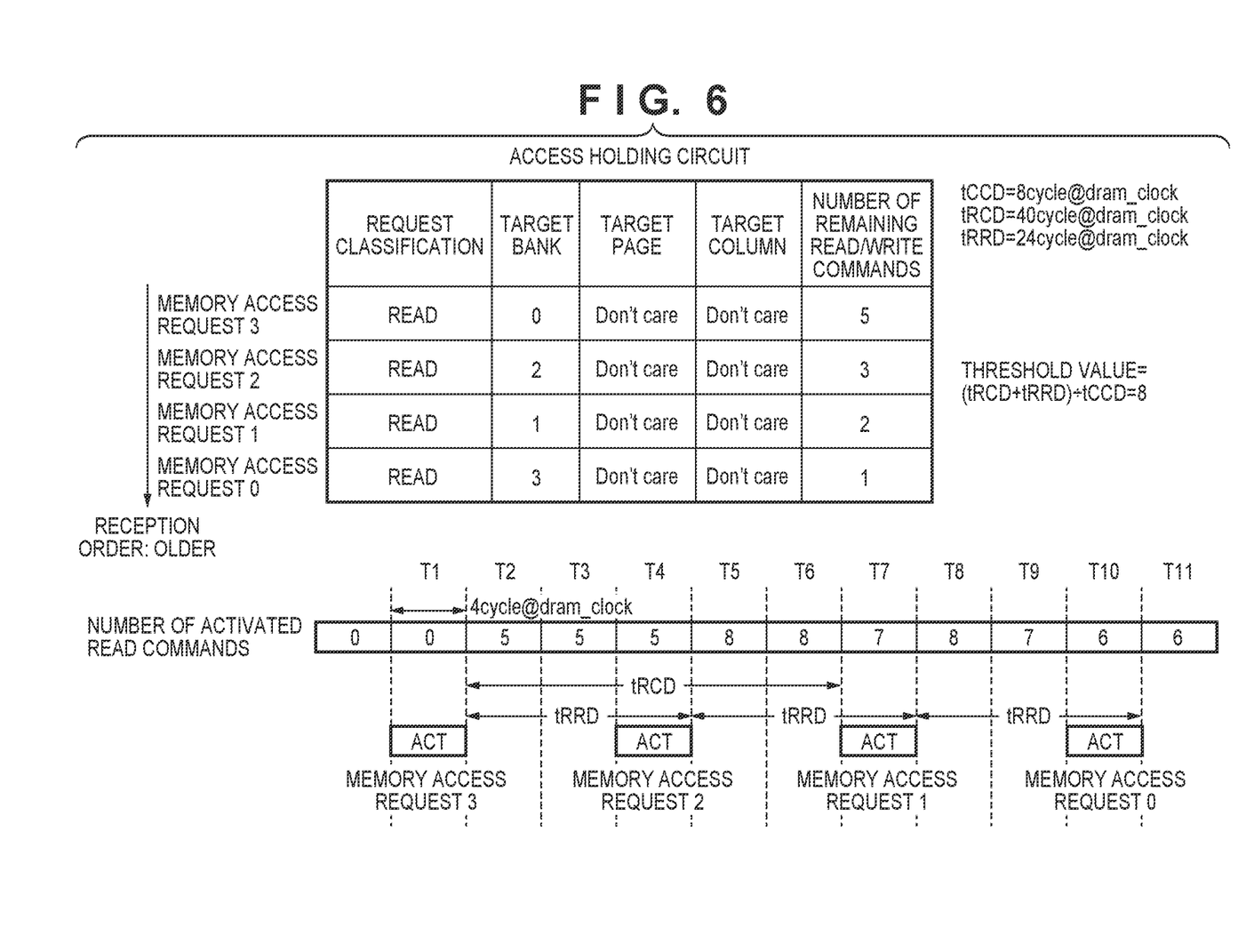
FIG. 6 is a diagram illustrating an operation example of the active command selection in the related art.

FIG. 6 is a diagram illustrating an operation example of the active command selection in the related art. The precondition is the same as the operation example in the present embodiment illustrated in FIG. 5. In the related art, the active command for the memory access request 0 including a smallest number of read commands or write commands is issued at a timing T10.

As described above, in consideration of the number of read commands, the number of write commands, and tRCD for which the active command is issued, the active command of the memory access request that can suppress a gap in a data path caused by tRRD is preferentially issued. As a result, it is possible to suppress the decrease in memory utilization efficiency caused by the tRRD without putting on hold for the issue of the active command of the memory access request including a small number of read commands or write commands for a long period of time.

In the above embodiment, although one example is illustrated as a bus-master, a plurality of bus masters may exist.

INDUSTRIAL APPLICABILITY

The present invention can be used for various memory controllers that are connected to the DRAM and issue the command by selecting any memory access request from the plurality of memory access requests.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-015139, filed Feb. 2, 2021, which is hereby incorporated by reference herein in its entirety.

What is claimed is:

1. A memory controller configured to access a memory including a plurality of banks, comprising:
   a holding circuit configured to hold a plurality of read or write access requests from a bus master;
   a read/write control circuit configured to select one of the access requests held in the holding circuit and issue a read command or a write command; and
   an active control circuit configured to select the access request held in the holding circuit and issue an active command,
   wherein the active control circuit includes a generation circuit that generates number of activated read commands and number of activated write commands, the number of activated read commands is the total number of read commands of an access for which the active command is issued among the access requests held in the holding circuit, and the number of activated write commands is the total number of the write commands of an access for which the active command is issued among the access requests held in the holding circuit, and a selection circuit that, when the number of activated read commands is equal to or more than a first threshold, preferentially issues the active command of an read access in which the number obtained by adding the number of read commands of each of the read accesses requiring issue of the active command among the accesses held in the holding circuit and the number of activated read commands is equal to or more than a second threshold and, when the number of activated write commands is equal to or more than the first threshold, preferentially issues the active command of a write access in which the number obtained by adding the number of write commands of each of the write accesses requiring the issue of the active command among the accesses held in the holding circuit and the number of activated write commands is equal to or more than the second threshold.

2. The memory controller according to claim 1, wherein
when the number of activated read commands is less than the first threshold, the selection circuit preferentially issues the active command of the read access in which the number of read commands of each of the read accesses requiring the issue of the active command among the access requests held in the holding circuit is equal to or more than a third threshold, and
when the number of activated write commands is less than the first threshold, the selection circuit preferentially issues the active command of the write access in which the number of write commands of each of the write accesses requiring the issue of the active command among the access requests held in the holding circuit is equal to or more than the third threshold.

3. The memory controller according to claim 1, wherein when there are the plurality of read access requests or the plurality of write access requests that prioritize the active command, the selection circuit preferentially issues the active command of the read access request or the write access request held in the holding circuit for the longest period of time.

4. The memory controller according to claim 2,
wherein the first threshold is the number of read commands or write commands that can be issued in a timing constraint period from the active command to the read command or the write command to a same bank,
wherein the second threshold is the number of read commands or write commands that can be issued in a period that is obtained by adding the timing constraint period from the active command to the read command or the write command to the same bank and the timing constraint period from the active command to the active command to a different bank, and
wherein the third threshold is the number of read commands or write commands that can be issued for the timing constraint period from the active command to the active command to the different bank.

5. The memory controller according to claim 1,
wherein the read/write control circuit issues the read command and the write command based on a priority direction indicating which of the read command and the write command is preferentially issued, and
wherein the selection circuit preferentially issues the active command of the access corresponding to the priority direction among the read access request and the write access request preferentially issuing the active command.

6. A method of controlling a memory controller configured to access a memory including a plurality of banks, wherein the memory controller comprises:
a holding circuit configured to hold a plurality of read or write access requests from a bus master;
a read/write control circuit configured to select one of the access requests held in the holding circuit and issue a read command or a write command; and
an active control circuit configured to select the access request held in the holding circuit and issue an active command,
wherein the method comprising, by the active control circuit,
generating number of activated read commands and number of activated write commands, the number of activated read commands is the total number of read commands of an access for which the active command is issued among the access requests held in the holding circuit, and the number of activated write commands is the total number of the write commands of an access for which the active command is issued among the access requests held in the holding circuit, and
when the number of activated read commands is equal to or more than a first threshold, preferentially issuing the active command of an read access in which the number obtained by adding the number of read commands of each of the read accesses requiring issue of the active command among the accesses held in the holding circuit and the number of activated read commands is equal to or more than a second threshold and,
when the number of activated write commands is equal to or more than the first threshold, preferentially issuing the active command of a write access in which the number obtained by adding the number of write commands of each of the write accesses requiring the issue of the active command among the accesses held in the holding circuit and the number of activated write commands is equal to or more than the second threshold.

* * * * *